United States Patent [19]

Yamagami et al.

[11] Patent Number: 5,316,645
[45] Date of Patent: May 31, 1994

[54] PLASMA PROCESSING APPARATUS

[75] Inventors: Atsushi Yamagami; Nobuyuki Okamura, both of Kawasaki; Tadahiro Ohmi, 1-17-301, Komegabukuro 2-chome, Aoba-ku, Sendai-shi, Miyagi-Ken; Haruhiro H. Goto; Tadashi Shibata, both of Sendai, all of Japan

[73] Assignees: Canon Kabushiki Kaisha; Applied Materials Japan Inc.; Tadahiro Ohmi, Tokyo, Japan

[21] Appl. No.: 22,599

[22] Filed: Feb. 17, 1993

Related U.S. Application Data

[63] Continuation of Ser. No. 898,371, Jun. 15, 1992, abandoned, which is a continuation of Ser. No. 741,767, Aug. 7, 1991, abandoned.

[30] Foreign Application Priority Data

Aug. 7, 1990 [JP] Japan ................................. 2-207537

[51] Int. Cl.⁵ .............................................. C23C 14/34
[52] U.S. Cl. ......................... 204/298.06; 204/192.12; 204/298.08; 204/298.34
[58] Field of Search ................. 204/192.12, 298.06, 204/298.08, 298.34

[56] References Cited

U.S. PATENT DOCUMENTS

| 3,763,031 | 10/1973 | Scow et al. | 204/298.08 |
| 4,038,171 | 7/1977 | Moss et al. | 204/298.06 |
| 4,464,223 | 8/1984 | Gorin | 156/643 |
| 4,818,359 | 4/1989 | Jones et al. | 204/298.06 |
| 4,874,494 | 10/1989 | Ohmi | 204/298.06 |
| 4,997,539 | 3/1991 | Komizo et al. | 204/298.06 X |
| 5,006,192 | 4/1991 | Deguchi | 204/298.06 X |
| 5,006,218 | 4/1991 | Yoshida et al. | 204/298.06 |

FOREIGN PATENT DOCUMENTS

| 0145015 | 6/1985 | European Pat. Off. . | |
| 0261347 | 3/1988 | European Pat. Off. . | |
| 0435838 | 7/1991 | European Pat. Off. . | |
| 16975 | 1/1984 | Japan | 204/298.06 |
| 59-104111 | 6/1984 | Japan . | |
| 61-231172 | 10/1986 | Japan . | |
| 2050957 | 2/1990 | Japan | 204/298.06 |
| 2159370 | 6/1990 | Japan | 204/298.06 |

Primary Examiner—Nam Nguyen
Attorney, Agent, or Firm—Fitzpatrick, Cella, Harper & Scinto

[57] ABSTRACT

A plasma processing apparatus comprises: a first electrode connectable with a plasma generating power source; a second electrode capable of supporting a substrate to be subjected to a plasma-involving surface treatment; a third electrode enclosing a space between the first and second electrodes, all the electrodes being positioned in an evacuatable chamber; and potential control means for controlling the potential of the third electrode.

7 Claims, 18 Drawing Sheets

PLASMA PROCESSING APPARATUS

This application is a continuation of application Ser. No. 07/898,371 filed Jun. 15, 1992, which is a continuation of application Ser. No. 07/741,767 filed Aug. 7, 1991, now all abandoned.

BACKGROUND OF THE INVENTION

1. Field of the Invention

The present invention relates to a plasma processing technology, and more particularly to a technology for controlling plasma potential and substrate potential, adaptable advantageously, for example, to a sputtering apparatus for forming a Si, Al or $SiO_2$ film on a substrate in the preparation of semiconductor devices.

2. Related Background Art

Sputtering has been employed as a method for forming a thin film on a substrate such as a semiconductor wafer. In the ordinary sputtering method, in a chamber that can be evacuated (vacuum chamber), there is generated a vacuum state of about $10^{-3}$ to $10^{-2}$ Torr, and a DC or high frequency power is applied to a first electrode, supporting a target, to generate plasma discharge, thereby accelerating cations to and bombarding the first electrode constituting a cathode by the cathode voltage drop. Atoms released by the impact from the target material provided on said first electrode are deposited on a substrate placed in the vacuum chamber and form a thin film thereon.

In a biased sputtering method, which is recently attracting attention, a DC or high frequency power is applied also to a second electrode supporting the substrate and positioned opposite to the first electrode receiving the plasma generating power, whereby the cations are also accelerated toward and bombard the substrate during film formation.

Alternatively, there is also proposed, for example in the Japanese Laid-open Patents Sho 59-104111 and Sho 61-231172, a method of positioning a third electrode in the vicinity of the substrate or the target and effecting film formation while a DC voltage is applied between said third electrode and the ground.

With the continuing progress in the performance and level of integration of semiconductor devices, the requirements for the quality of films obtained by film forming methods such as sputtering for use in such semiconductor devices have become more and more stringent.

Conventional sputtering methods are not necessarily capable of satisfactorily responding to such requirements.

For example in the ordinary sputtering method, the plasma potential is determined by the plasma discharge conditions (discharge pressure, electric power, electrode size etc.), and it is difficult to control the plasma potential at an arbitrary value independently from the plasma discharge conditions. Also the substrate potential may be floating with respect to the ground potential or the plasma, depending on the material of the substrate and the state of positioning thereof, so that the controllability of substrate potential is also poor. Consequently the energy of cations entering the substrate at the film formation (corresponding to the difference between the plasma potential and the substrate potential) is difficult to control, and this fact may lead to deterioration of the film quality. Also the plasma potential may be significantly elevated under certain plasma discharge conditions, showing a large potential difference to the vacuum chamber or a deposition preventing plate, with which the plasma comes into contact. Consequently the cations in the plasma hit such vacuum chamber or deposition preventing plate, and the atoms emitted therefrom tend to enter the thin film formed on the substrate. For this reason, there is inevitably a limit in the reduction of contamination in the resulting thin film, resulting from materials from such vacuum chamber or deposition preventing plate.

On the other hand, the aforementioned biased sputtering is capable of forming a thin film with impact of cations of a larger energy than in the ordinary sputtering, by the control of the substrate potential, thereby providing a thin film of an improved mechanical strength. Also, this biased sputtering can provide a film of flat surface, utilizing a fact that a film formed on a stepped portion is easily subjected to sputter etching. This method, however, is associated with a drawback of a very small film forming speed, since the sputter etching is conducted simultaneously with the film formation. Also it may damage the substrate, since the film formation is conducted with direct bombardment of the substrate with cations of a larger energy than in the ordinary sputtering. Also as the controllability of the plasma potential is as poor as in the ordinary sputtering, the cations in the plasma tend to hit the vacuum chamber or the deposition preventing plate, whereby the atoms emitted therefrom tend to enter the thin film formed on the substrate, and there is inevitably a limit in reducing the migration of such contaminates into the film.

In the sputtering method disclosed in the aforementioned Japanese Laid-open Patent Sho 59-104111, a rod-shaped third electrode opposed to the substrate is given a positive voltage to elevate the plasma potential, whereby the film formation is conducted with a substantial negative bias voltage applied to a part of the substrate. This method can provide a thin film for example with improved magnetic characteristics. However a positive voltage applied to the third electrode elevates the plasma potential, thus increasing the difference between the plasma potential and the substrate potential and eventually causing, in certain cases, bombardment of the substrate with cations of a larger energy than in the method without the third electrode. In such case the damage to the substrate becomes more apparent. Also the elevation of the plasma potential further increases the difference between the plasma potential and the vacuum chamber or the deposition preventing plate, and the atoms emitted from such members by the impact of cations easily enter the thin film formed on the substrate, so that a film with a relatively high contamination with the materials from such vacuum chamber or deposition preventing plate is often obtained.

Also in the sputtering method disclosed in the aforementioned Japanese Laid-open Patent Sho 61-231172, a third electrode is positioned in the vicinity of the target, and the potential of said third electrode is controlled to vary the plasma potential, whereby the film formation on the substrate is conducted under controlled current into the substrate. The object of this method is to achieve film formation by sputtering with reduced damage.

However, if the substrate or the film to be formed thereon is an insulating material, the current flowing into the substrate is zero even with the voltage application to the third electrode, since the ion current becomes equal to the electron current. It is therefore not possible to control the current into the substrate by the potential control on the third electrode, so that the prevention of damage of the substrate cannot be achieved by the voltage application to the third electrode.

Also in case of a positive voltage application to the third electrode, the plasma potential is elevated to increase the potential difference between the plasma potential and the vacuum chamber or deposition preventing plate, thereby resulting in the drawback, as in the aforementioned sputtering methods, of contamination of the thin film formed on the substrate, by the atoms emitted from such vacuum chamber or deposition preventing plate by the bombardment of the accelerated cations.

As explained in the foregoing, the conventional sputtering methods have been associated with a limit in the reduction of contamination from the vacuum chamber, deposition preventing plate etc., and possible damages in the substrate.

Consequently the conventional sputtering methods are often not adequate for the manufacture of products of high quality.

SUMMARY OF THE INVENTION

An object of the present invention is to provide a plasma processing apparatus capable of sufficiently reducing the influence of contaminants from the vacuum chamber, deposition preventing plate etc. in various plasma-involving processes, for example the entry of such contaminants into the film at the formation thereof.

Another object of the present invention is to provide a plasma processing apparatus capable of preventing the damage to the substrate.

Still another object of the present invention is to provide a plasma processing apparatus capable of providing a high film forming speed.

Still another object of the present invention is to provide a plasma processing apparatus capable of precise film quality control at film formation.

Still another object of the present invention is to provide a plasma processing apparatus comprising, in a space that can be evacuated, a first electrode connectable to a plasma generating power source; a second electrode capable of supporting a substrate to be subjected to a plasma-involving surface treatment; a third electrode enclosing a space between said first and second space; and potential control means for controlling the potential of said third electrode.

DESCRIPTION OF THE PREFERRED EMBODIMENTS

The plasma processing apparatus of the present invention is featured by a first electrode connectable to a plasma generating power source; a second electrode capable of supporting a substrate subjected to a plasma-involving surface treatment; a third electrode enclosing a space between said first and second electrodes, all said electrodes being positioned in a chamber which can be evacuated (vacuum chamber); and control means for controlling the potential of said third electrode.

According to the present invention, the controllability of the plasma potential and the substrate potential can be significantly improved by the potential control of a third electrode which encloses a space defined by first and second electrodes which are mutually opposed for plasma-involving process.

As a result, precise film quality control is rendered possible in the film formation.

Also the energy control on cations entering the substrate in the course of plasma-involving process, thereby enabling film formation with reduced substrate damage or with a high film forming speed.

Furthermore, since the difference between the plasma potential and the potential of the third electrode can be controlled, the number of atoms emitted from the third electrode by the impact of accelerated cations can be reduced. Also the contaminants emitted for example of the wall of the vacuum chamber by the impact of accelerated cations can be effectively intercepted by said third electrode, whereby the amount of such contaminants reaching the substrate can be significantly reduced and the film formation can therefore be conducted with a high purity.

Figure 12:
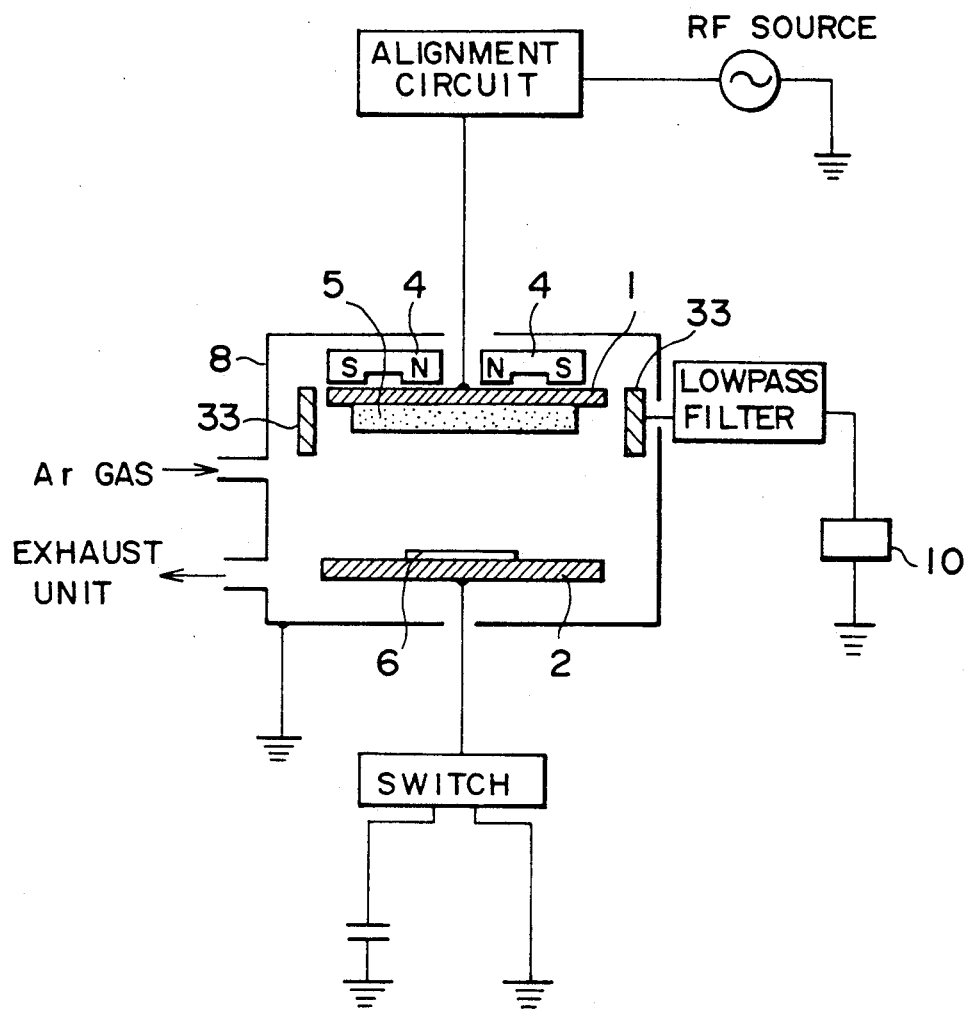
FIG. 12 is a schematic cross-sectional view of a conventional sputtering apparatus.

In the present invention, the enclosure of the space between the first and second electrode by the third electrode means a state where the space between the first and second electrodes is included in a space continuously or uncontinuously surrounded by the third electrode, and an electrode arrangement shown in FIG. 12, for example, is not included in this concept.

Now the present invention will be clarified in detail with reference to the attached drawings.

Figure 1:
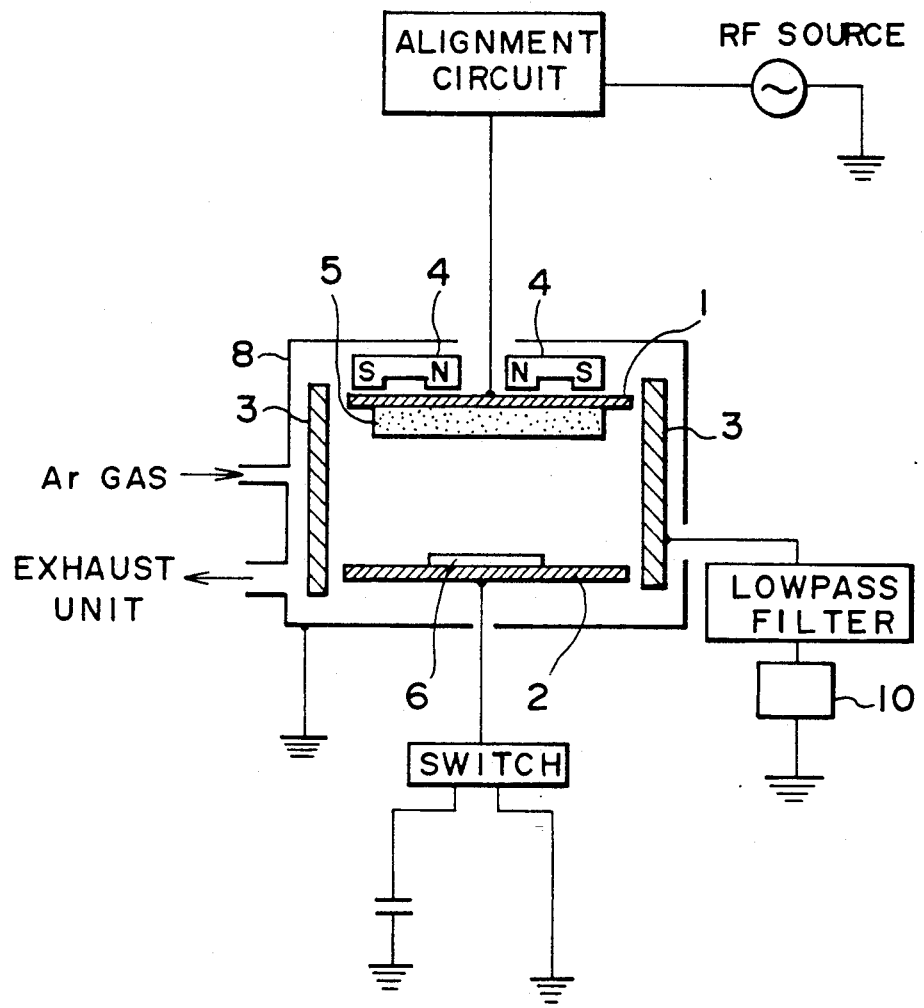
FIGS. 1, 3, 5, 7 and 13 are schematic partial views of embodiments of the apparatus of the present invention.

FIG. 1 is a partial schematic cross-sectional view of a plasma processing apparatus of the present invention, adapted for use as a sputtering apparatus.

There are shown a first electrode 1 which is connected through a matching circuit to a high frequency (RF) power source serving as a plasma generating power source and which can support a marget material 5; a second electrode 2 capable of supporting a substrate and being maintained at a ground potential or a floating potential by a switch; a third electrode 3 enclosing the space between the first electrode 1 and the second electrode 2; magnets 4 for inducing magnetron discharge on the target 5; a target material 5; a substrate 6; a vacuum chamber 8; and a power source 10 for controlling the potential of the third electrode 3 through a low-pass filter. The third electrode can be composed of a non-insulating material such as stainless steel, Cu, Al, Ta, Mo, Nb, Ti or Si. Said third electrode can be fixed to the vacuum chamber by an insulating member composed for example of alumina, ceramics or glass.

The film formation in the above-explained apparatus can be conducted, for example, in the following manner.

The substrate 6 is mounted on the second electrode 2, then the vacuum chamber 8 is evacuated to a predetermined pressure by a vacuum unit, and the third electrode 3 is maintained at a predetermined potential. Then inert gas such as argon is introduced into the vacuum chamber 8, with a predetermined pressure. An RF potential is applied to the first electrode 1 to induce discharge, thus generating plasma and effecting film formation.

The potential of the third electrode is suitably selected according to the film forming conditions to be employed and the effects to be attained by the third electrode.

For example, as will be shown in the following examples, the effects shown in FIGS. 2A to 2C can be attained by suitable selection of the potential of the third electrode.

The structure of the third electrode is not limited as long as it can therein accommodate the first electrode 1 and the second electrode 2.

Figure 9:
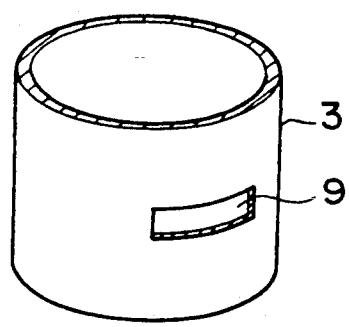
FIGS. 9 to 11 are schematic views showing examples of the structure of the third electrode.
Figure 10:
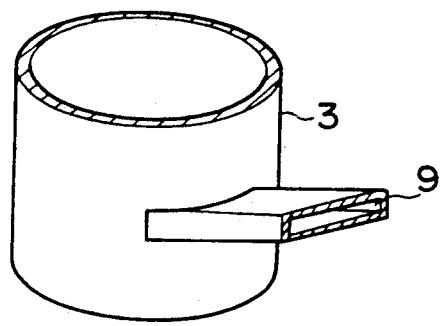

For example, it may have a cylindrical structure, as shown in FIG. 9, eventually with an aperture 9 for loading and unloading of the substrate.

Figure 13:
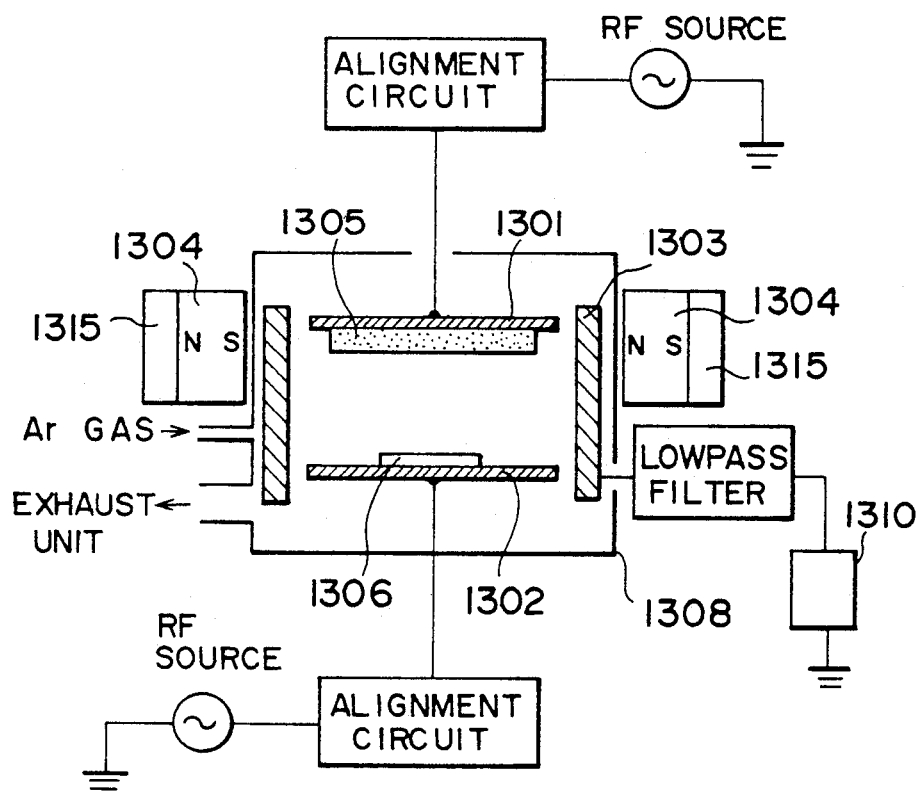

In the apparatus shown in FIG. 1, the arrangement of magnets for application of magnetic field around the target may be suitably modified, for example outside a vacuum chamber 1308 as shown in FIG. 13. Also the potential of the substrate 6 may be controlled for example by a DC power source through a low-pass filter or by an RF power source through a matching circuit to be explained later.

Figure 3:
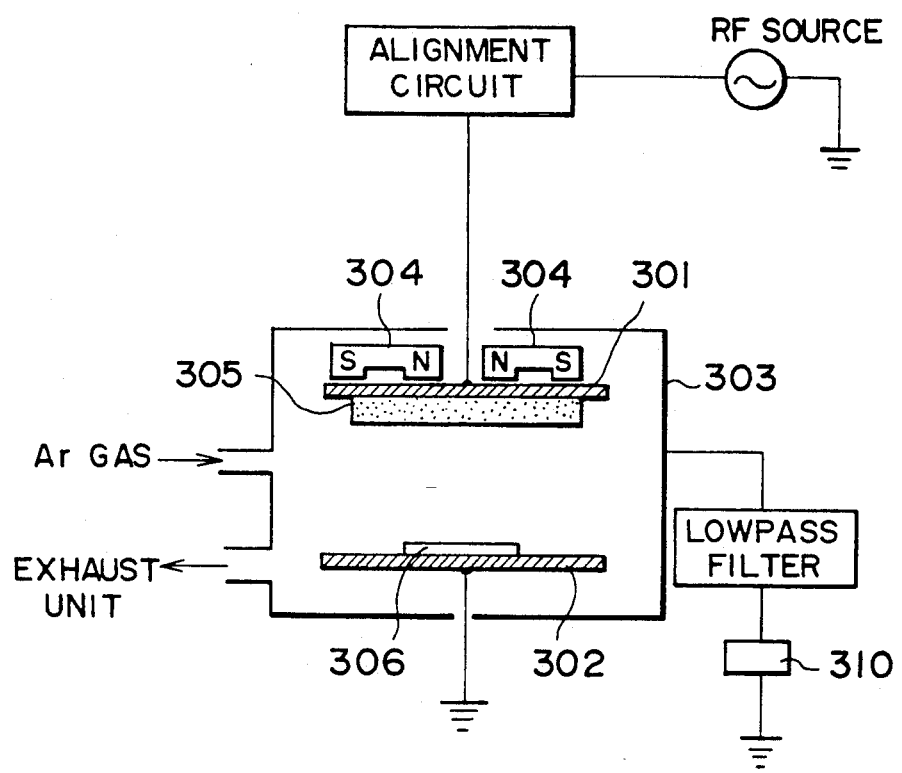

FIG. 3 illustrates another embodiment of the plasma processing apparatus of the present invention, which can also be utilized as a sputtering apparatus.

There are shown a first electrode 301 which is connected to a plasma generating RF power source through a matching circuit and which can support a target material 305; a second electrode 302 capable of supporting a substrate and maintained at the ground potential; a third electrode 303 serving also as a vacuum chamber; magnets 304 for inducing magnetron discharge on the substrate; a target material 305; a substrate 306; and a power source 310 for potential control of the third electrode 303 through a low-pass filter.

The film formation with the above-explained apparatus can be conducted for example in the following manner.

The substrate 306 is mounted on the second electrode 302, then the vacuum chamber consisting of the third electrode 303 is evacuated to a predetermined pressure by a vacuum unit, and said third electrode 303 is maintained at a predetermined potential. Then inert gas such as argon is introduced with a predetermined pressure into said vacuum chamber, and an RF potential is applied to the first electrode 301 to induce discharge, thereby effecting film formation.

As in the foregoing embodiments, the potential of the third electrode is suitably selected according to the film forming conditions and the effects to be attained.

Figure 5:
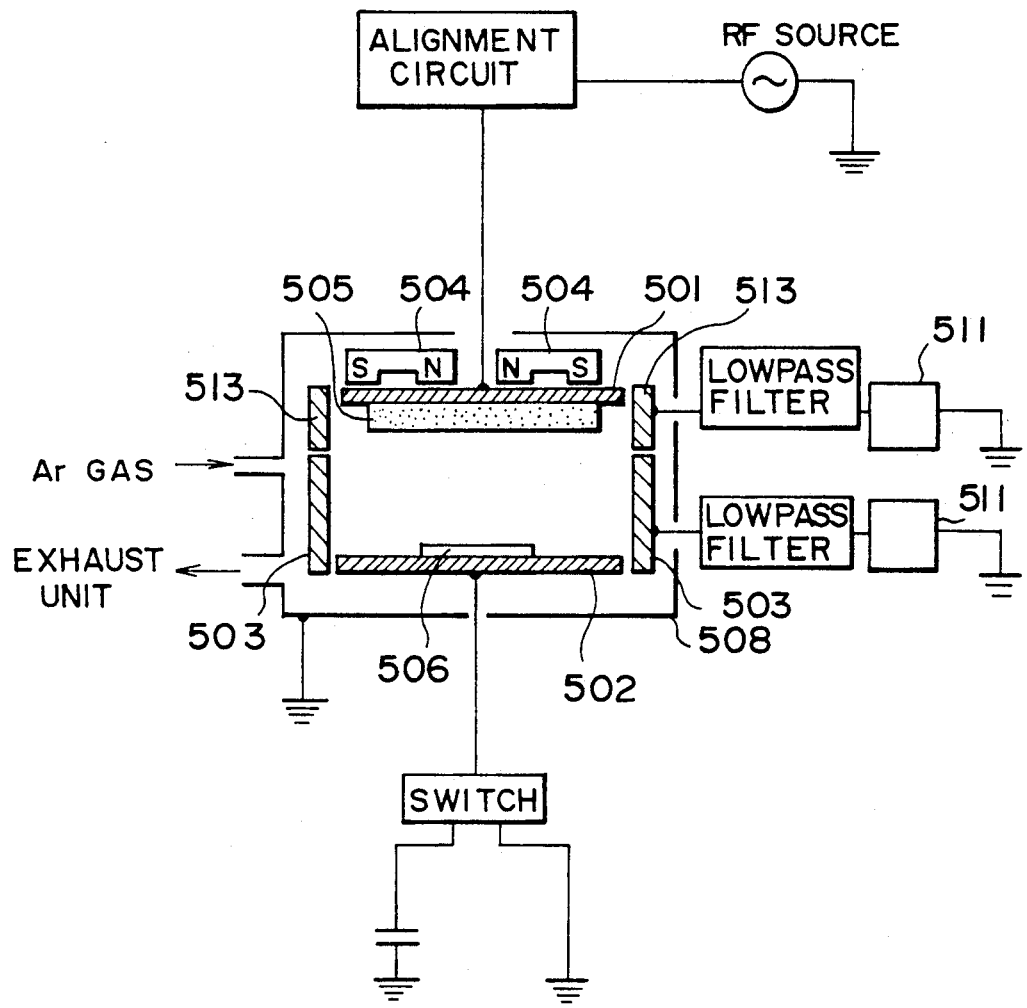

FIG. 5 shows another embodiment of the plasma processing apparatus of the present invention, in which the third electrode is divided into plural portions of which potentials can be independently controlled.

There are provided a first electrode 501 connected to a plasma generating RF power source through a matching circuit and capable of supporting a target material 505; a second electrode 502 capable of supporting a substrate 506 and being maintained at the ground potential or at a floating potential by a switch; a third electrode 503 of the substrate side positioned in the vicinity of the substrate; a third electrode 513 of the target side positioned in the vicinity of the target; magnets 504 for inducing magnetron discharge on the target 505; a target material 505; a substrate 506; a vacuum chamber 508; a power source 510 for controlling the potential of the third electrode of the substrate side through a low-pass filter; and a power source 511 for controlling the potential of the third electrode of the target side through a low-pass filter.

Film formation in the above-explained apparatus is conducted in the following manner.

The substrate 506 is mounted on the second electrode 502, then the vacuum chamber 508 is evacuated to a predetermined pressure by a vacuum unit, and the third electrode 503 of the substrate side and that 513 of the target side are regulated at predetermined potentials. Then an RF potential is applied to the first electrode 501 to induce discharge, thereby effecting film formation.

The manner of division of the third electrode is not limited to the illustrated one but may be conducted in various ways according to the necessity.

More specifically, in the illustrated example, the cylindrical third electrode is divided along the circumference thereof (horizontally in the illustration) into two portions, but it is also possible to effect the division into three or more portions, or in the circumferential and/or axial (vertical) direction.

The potentials of thus divided third electrodes are suitably selected according to the film forming conditions and the effects to be attained by said third electrodes.

The above-explained divided structure of the third electrode allows to improve the controllability on the spatial distribution of the plasma potential.

The entry of contaminants from the vacuum chamber 508 into the film can be almost completely prevented as long as the gap between the third electrode 503 of the substrate side and that 513 of the target side does not exceed several millimeters. Also the entry of such contaminants can be more securely prevented by filling said gap of the third electrodes 503, 513 with an insulating material.

Figure 7:
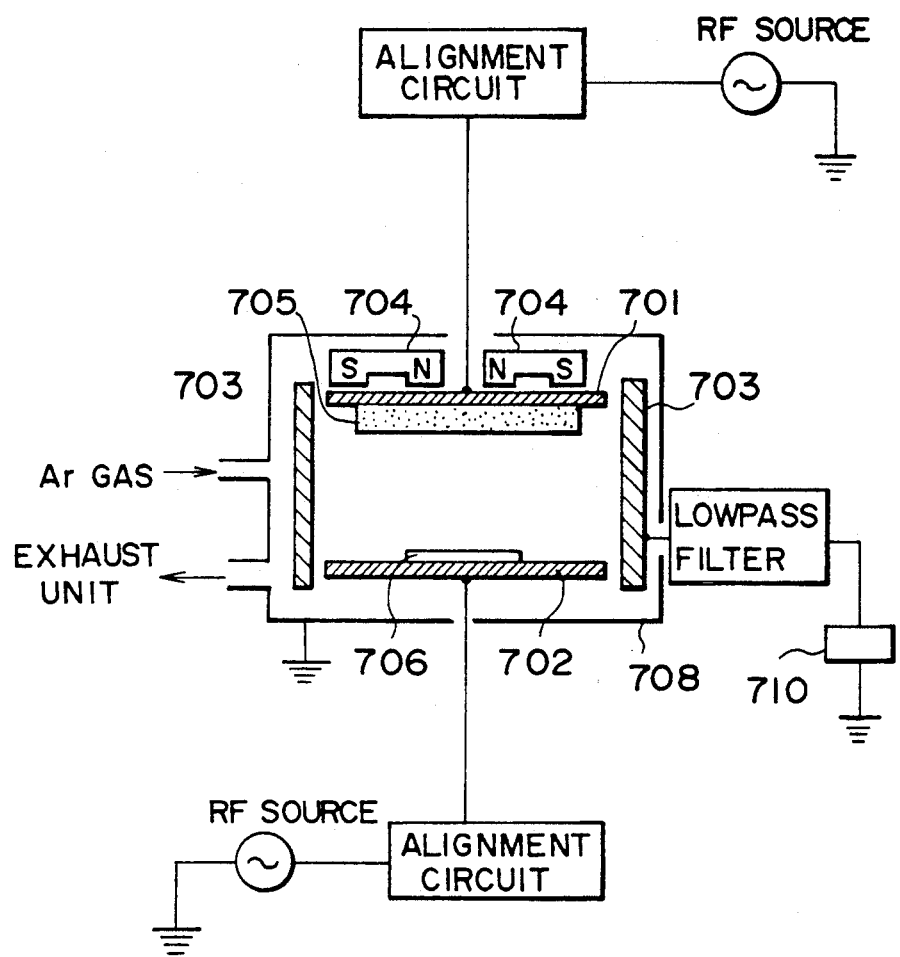

FIG. 7 shows another embodiment of the plasma processing apparatus of the present invention, which can be utilized as a sputtering apparatus.

There are provided a first electrode 701 connected to a plasma generating RF power source through a matching circuit and capable of supporting a target material 705; a second electrode 702 capable of supporting a substrate 706 and connected to an RF power source through a matching circuit and also to a potential control power source 710; a third electrode 703 enclosing a space between the first electrode 701 and the second electrode 702; magnets 704 for inducing magnetron discharge on the target material 705; a target material 705; a substrate 706; a vacuum chamber 708; and a power source 710 for potential control of the third electrode through a low-pass filter.

Film formation in the above-explained apparatus is conducted in the following manner.

The substrate 706 is mounted on the second electrode 702, then the vacuum chamber 708 is evacuated to a predetermined pressure by a vacuum unit, and the potentials of the third electrode 703 and of the second electrode 702 are respectively regulated at predetermined values. Then RF potentials are supplied to the first electrode 701 and the second electrode 702 to induce discharge, thereby effecting film formation.

As in the foregoing embodiments, the potential of the third electrode is suitably selected according to the film forming conditions and the effects to be attained by the third electrode.

In the above-explained apparatus, the potential to be supplied to the second electrode may be a DC potential if the substrate 706 placed on the second electrode 702 is conductive.

Figure 11:
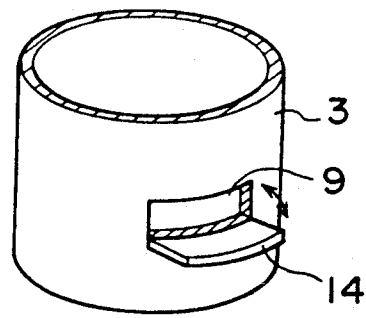

The cylindrical third electrode employed in the foregoing embodiments may also be provided in an aperture 9, as shown in FIG. 11, with a frame member that can be utilized as a guide in the transportation of the substrate, or, as shown in FIG. 12, with a door to improve the intercepting property of the third electrode during the film formation.

Figure 14:
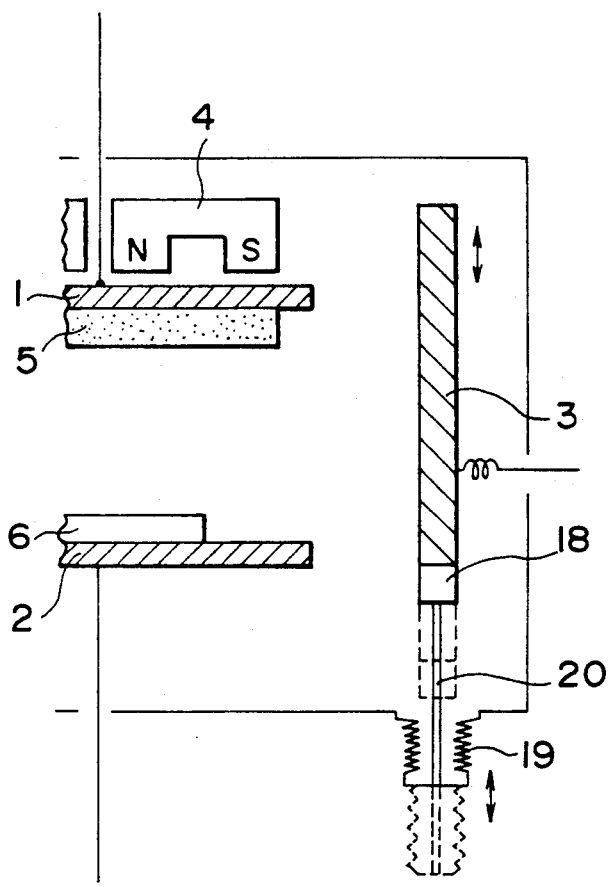
FIG. 14 is a schematic view showing an embodiment of the positioning of the third electrode in the vacuum chamber.

Furthermore, as shown in FIG. 14, it is possible to support the third electrode movably in the vertical direction by means of an insulating member 18 and a shaft 20 connected to bellows 19, thereby lifting said third electrode at the loading and unloading of the substrate and to place said electrode at the illustrated position at the film formation.

The present invention has been explained by various embodiments thereof, but the present invention is not limited to such embodiments and is subject to various modifications within the scope and spirit of the appended claims.

Also the plasma processing apparatus of the present invention is applicable not only to the film formation by sputtering but also to plasma CVD or sputter etching.

EXAMPLE 1

Silicon film formation was conducted with the apparatus shown in FIG. 1, under following conditions:

| | |
|---|---|
| RF power supplied to the first electrode: | 100 MHz, 100 W, |
| Potential of the second electrode: | floating potential or ground potential (0 V), |
| Potential of the third electrode: | −40–60 V (40 V), |
| Introduced gas: | Ar (100%), flow rate: 100 sccm, |
| Vacuum chamber pressure at film formation: | 5 mTorr, |
| Lowest pressure reached in the vacuum chamber: | $1.2 \times 10^{-9}$ Torr |
| Substrate temperature: | 350° C. |
| Target material: | Si |

Figure 2A:
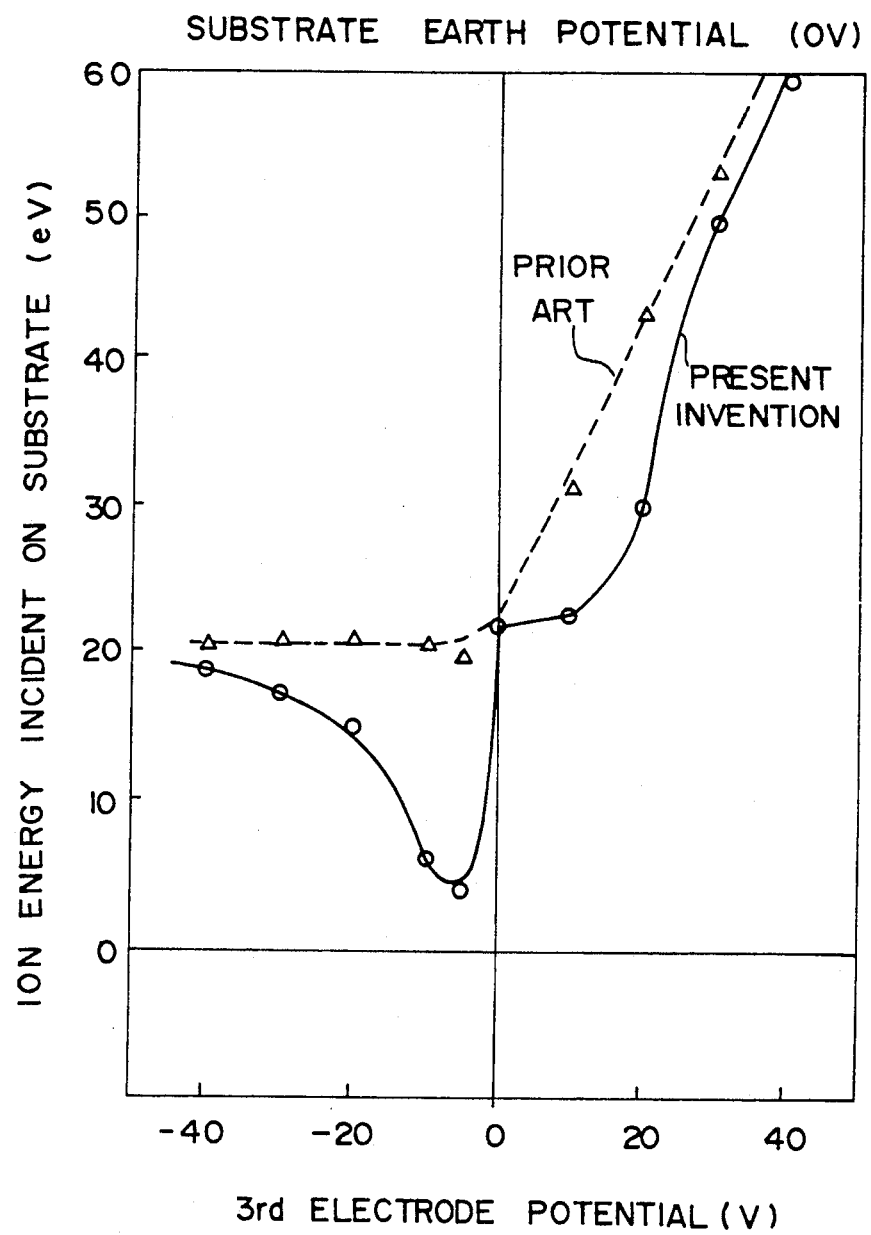
FIGS. 2A to 2C are charts indicating results obtained in an example 1 and a reference example 1.

The measured control range of the incident ion energy when the substrate was maintained at the ground potential is shown in FIG. 2A.

The incident ion energy was measured with a Faraday cup of reflective electric field type.

Figure 2B:
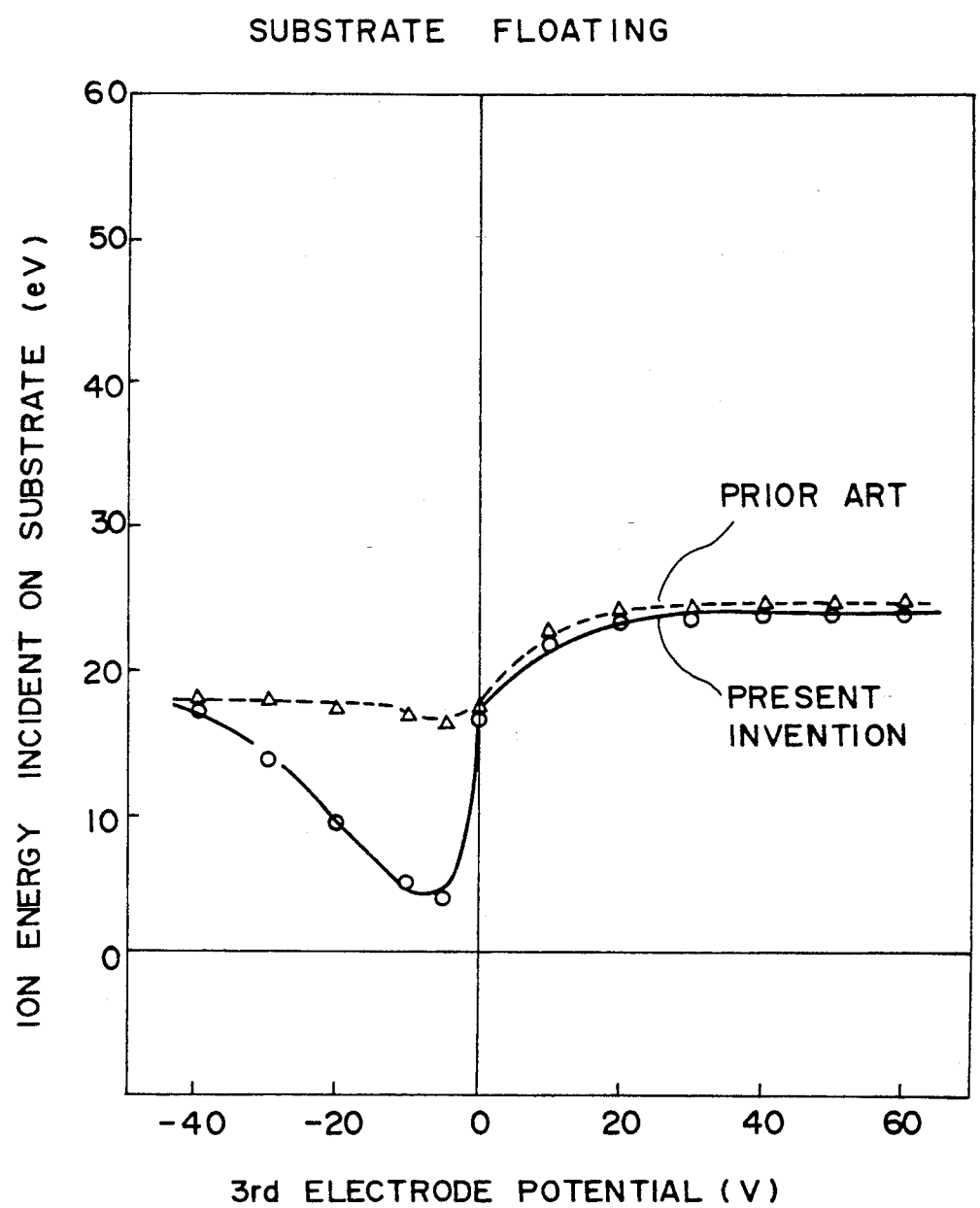
Figure 2C:
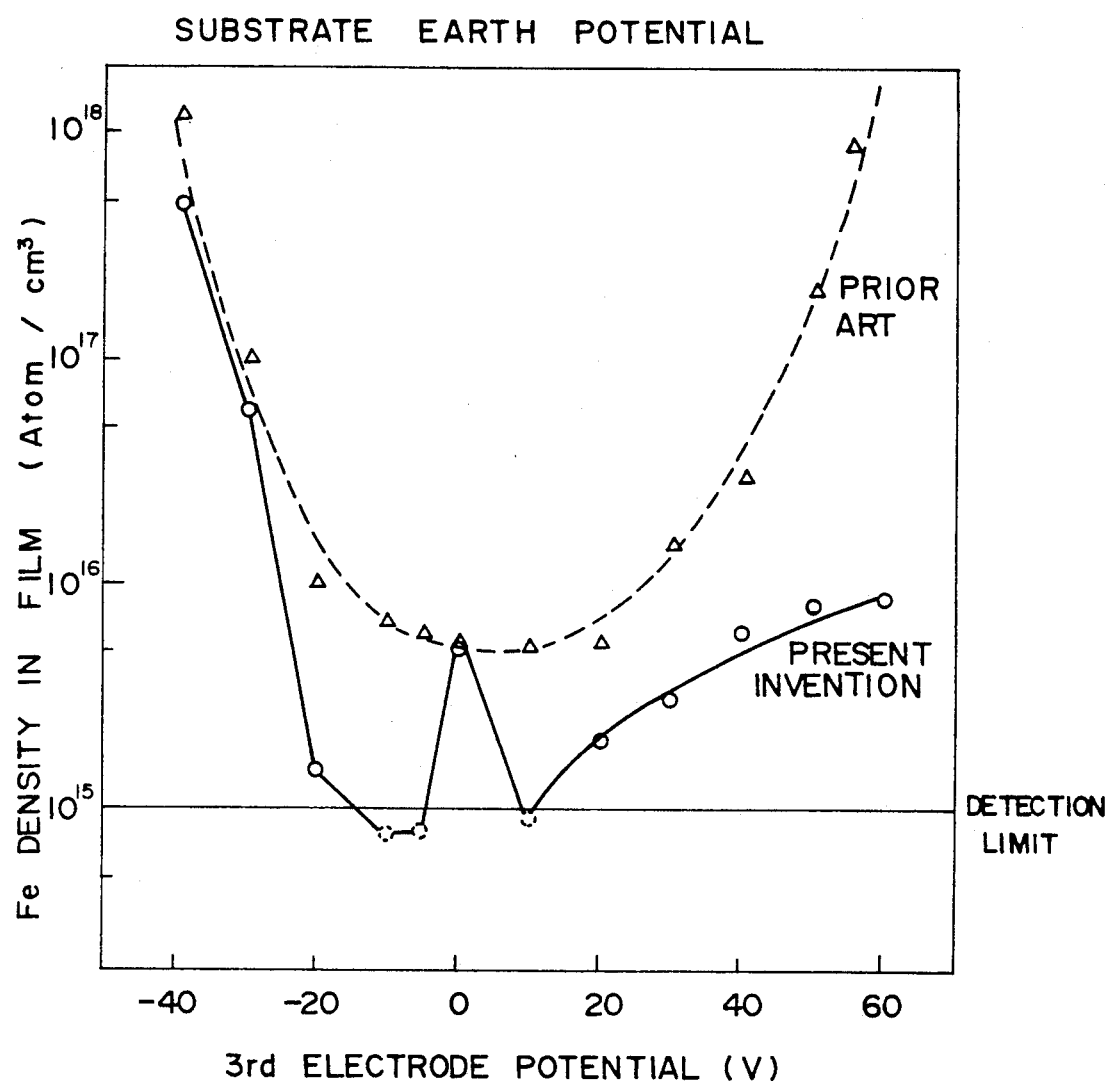

Also FIG. 2C shows the result of measurement by SIMS (secondary ion) mass spectroscopy, on the concentration of Fe, which is the principal component of the vacuum chamber and the third electrode, incorporated into the Si film formed on the substrate.

Also FIG. 2B shows the control range of the incident ion energy when the substrate was maintained at the floating potential.

Similar results could be obtained also by controlling the substrate potential with a DC power source through a low-pass filter or with an RF power source through a matching circuit.

REFERENCE EXAMPLE 1

Silicon film formation was conducted with the apparatus shown in FIG. 12, under the same conditions as those in the example 1, and measurement were conducted as in the example 1. The results are shown in FIGS. 2A to 2C.

Comparison of the results of the example 1 and the reference example 1 reveals following advantages of the apparatus of the example 1.

As shown in FIG. 2A, when the substrate was maintained at the ground potential, the control range of the incident ion energy in the example 1 was 4–60 eV (third electrode potential −40–40 V), thus being extended in the low energy side, in comparison with that in the reference example 1 of 20–60 eV (third electrode potential −40–40 V). Also when the substrate was maintained at the floating potential, as shown in FIG. 2B, the control range of the incident ion energy in the example 1 was 3.5–23.5 eV (third electrode potential −40–60 V), thus again extended in the low energy side, in comparison with 16–24 eV (third electrode potential −40–60 V). Furthermore, as shown in FIG. 2C, the Fe concentration in the Si film formed with the substrate maintained at the ground potential under the same discharge conditions was about 10 times smaller, for example, in the comparison of minimum values.

The above-explained facts reveal that the use of a third electrode enclosing the space between the first and second electrodes and the control of potential of said third electrode provide the effects of extending the control range of the incident ion energy to the substrate, in comparison with the potential control of the third electrode 33 positioned in the vicinity of the target in the conventional apparatus (reference example 1), and of reducing the contamination of the film from the vacuum chamber 8 and the third electrode 3 (or 33).

EXAMPLE 2

Film formation was conducted with the apparatus shown in FIG. 3, with following conditions:

| | |
|---|---|
| RF power to the first electrode: | 100 MHz, 100 W, |
| Potential of the second electrode: | ground potential (0 V), |
| Potential of the third electrode: | −40–60 V |
| Introduced gas: | Ar (100%), flow rate: 100 sccm, |
| Vacuum chamber pressure at film formation: | 5 mTorr, |
| Minimum pressure reached in vacuum chamber: | $1.2 \times 10^{9}$ Torr, |
| Substrate temperature: | 350° C. |
| Target material: | Si, |
| Substrate: | Si wafer. |

Figure 4A:
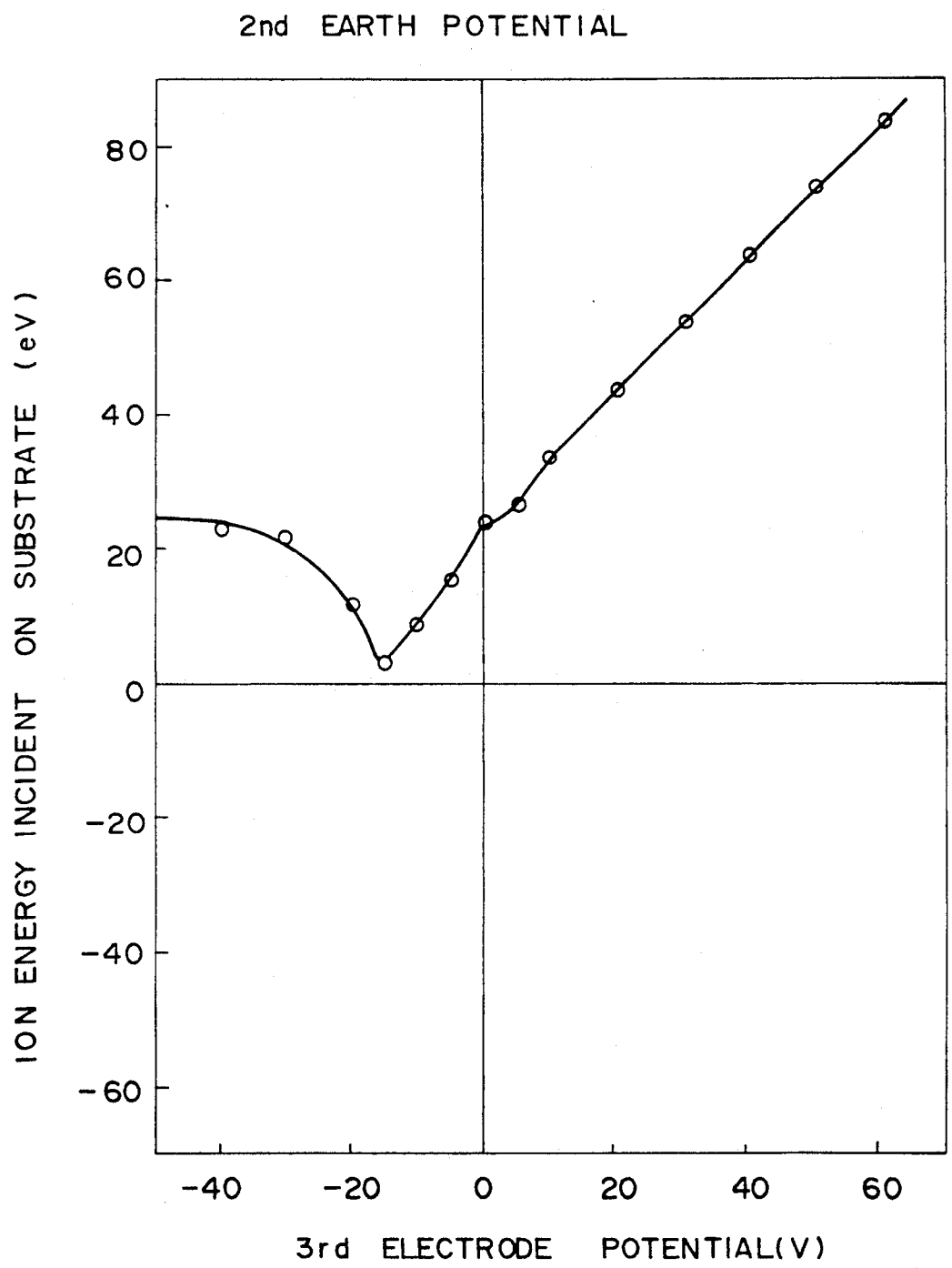
FIGS. 4A and 4B are charts indicating results obtained in an example 2.

The control range of the incident ion energy at the film formation was measured in the same manner as in the example 1, with results shown in FIG. 4A. In the above-mentioned apparatus, the energy of the ions incident to the substrate could be varied in a range of 3–84 eV (third electrode potential: −40–60 V).

Figure 4B:
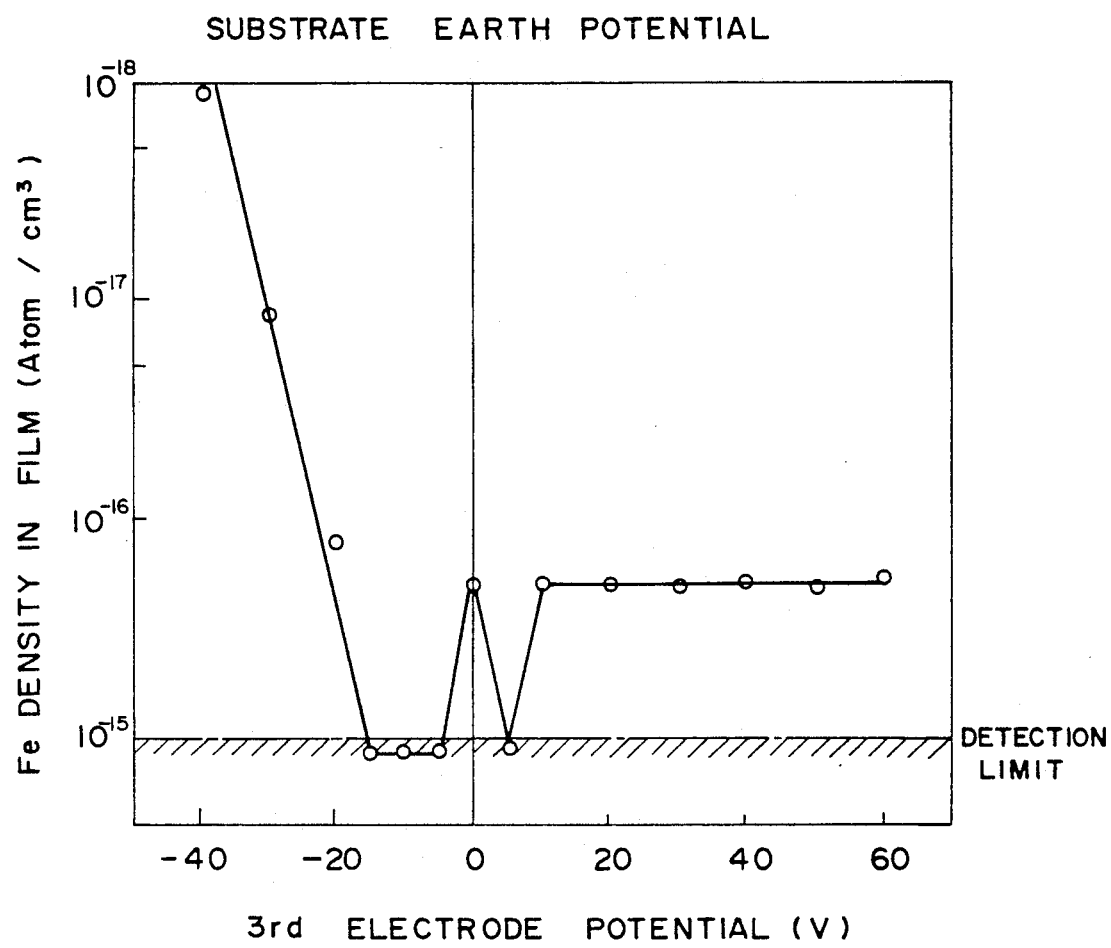

FIG. 4B shows the result of measurement by SIMS on the Fe concentration present in the formed Si film and resulting from the third electrode 303. The results indicate that the Fe concentration can be maintained below the detection limit (below $1 \times 10^{15}$ atom/cm$^3$, by maintaining the third electrode potential within a range of $-15$ to $-5$ V or at 5 V.

EXAMPLE 3

Film formation was conducted with the apparatus shown in FIG. 5 and under following conditions:

| | |
|---|---|
| RF power to the first electrode: | 100 MHz, 100 W, |
| Potential of the second electrode: | floating potential or ground potential (0 V), |
| Potential of the third electrode at the substrate side: | $-5$ V, |
| Potential of the third electrode at the target side: | $-40-60$ V, |
| Introduced gas: | Ar (100%), flow rate: 100 sccm, |
| Vacuum chamber pressure at film formation: | 5 mTorr, |
| Minimum pressure reached in vacuum chamber: | $1.2 \times 10^{-9}$ Torr, |
| Substrate temperature: | 350° C., |
| Target material: | Si, |
| Substrate: | Si wafer. |

The control range of the incident ion energy in the film formation under the above-mentioned conditions with the second electrode maintained at the ground potential (0 V), measured as in the example 1, was 3–75 eV (potential of the third electrode at the target side: $-40--60$ V), as shown in FIG. 6A.

Figure 6A:
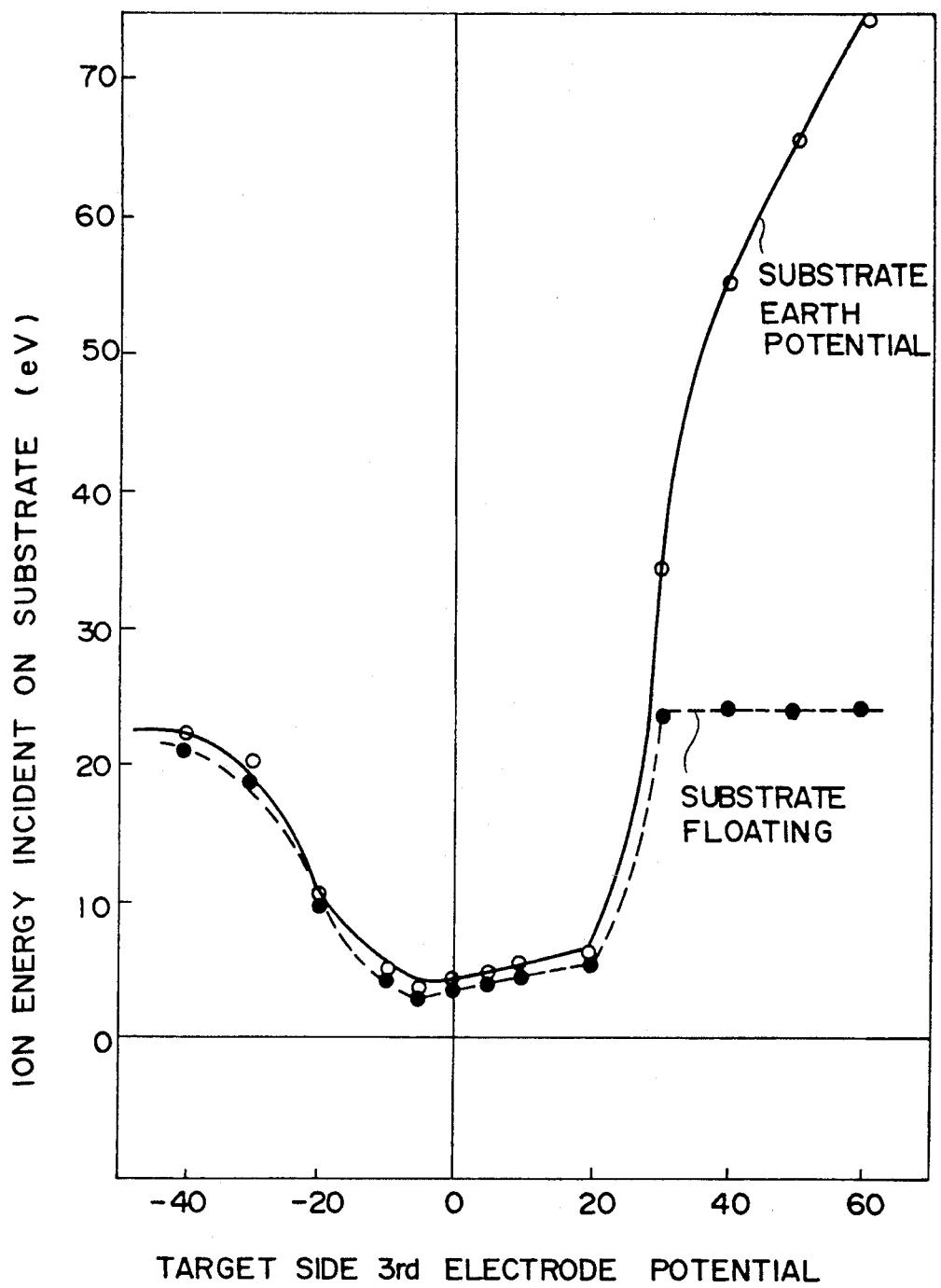
FIGS. 6A and 6B are charts indicating results obtained in an example 3.
Figure 6B:
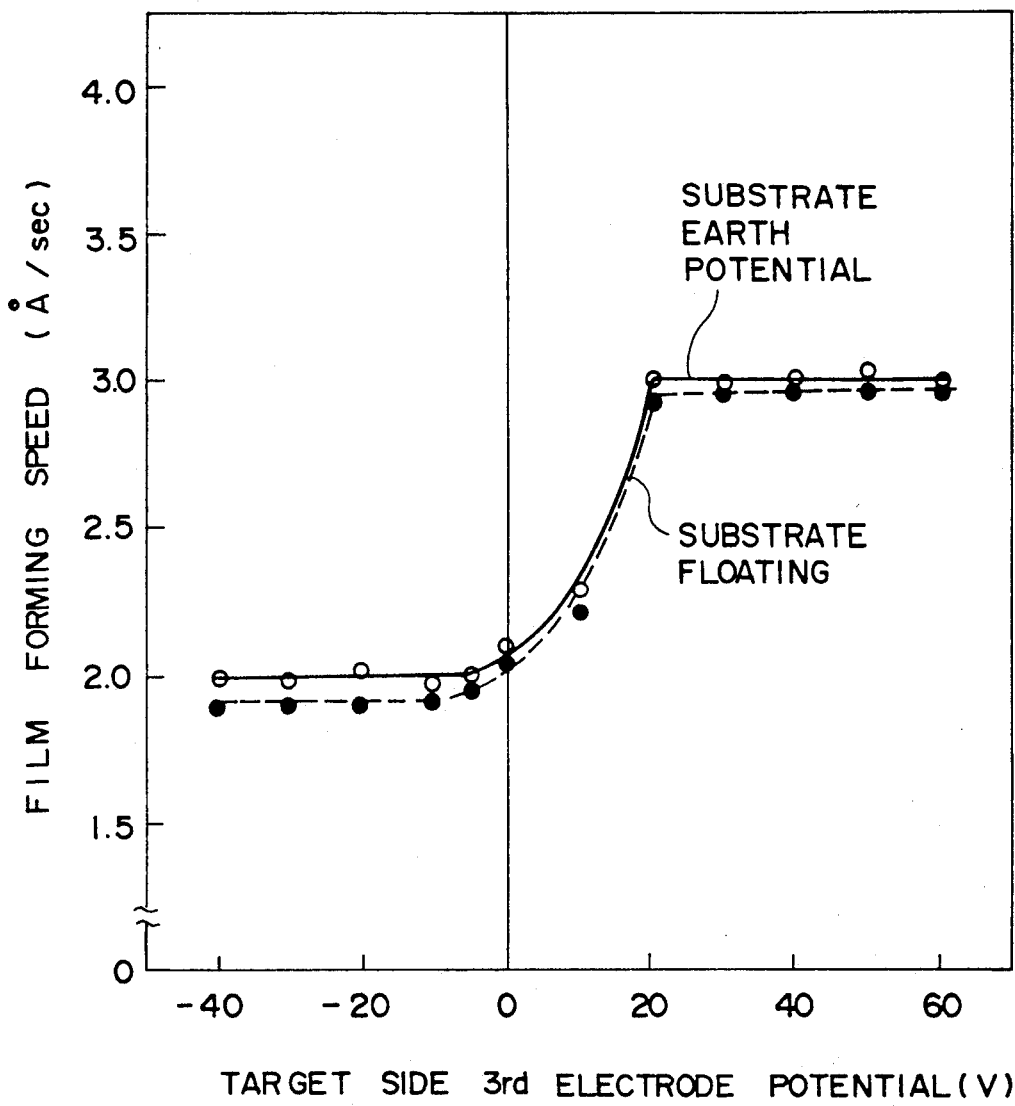

The Si film forming speed varied in a range of 2–3 Å/sec. according to the potential of the third electrode at the target side, as shown in FIG. 6B.

Also in the film formation with the substrate maintained at the floating potential and under the above-mentioned conditions, the control range of the incident ion energy and the Si film forming speed respectively varied in a range of 3–22 eV as shown in FIG. 6A and in a range of 1.8–3.8 Å/sec. as shown in FIG. 6B, according to the variation in the potential of the third electrode at the target side.

These facts indicate that the divided structure of the third electrode in the target side and the substrate side in the apparatus of this example can increase the film forming speed without change in the energy of ions incident to the substrate 506, in the potential control of the third electrode 513 at the target side, in comparison with the apparatus shown in FIG. 1 employing an undivided third electrode, thereby further improving the productivity while maintaining the high quality of the film.

EXAMPLE 4

Film formation was conducted with the apparatus shown in FIG. 7, under the following conditions:

| | |
|---|---|
| RF power to the first electrode: | 100 MHz, 100 W, |
| Power to the second electrode: | 177 MHz, 0–100 W, |
| Potential of the third electrode: | $-5$.V, |
| Introduced gas: | Ar (100%), flow rate: 100 sccm, |
| Vacuum chamber pressure at film formation: | 5 mTorr, |
| Minimum pressure reached in vacuum chamber: | $1.2 \times 10^{-9}$ Torr, |
| Substrate temperature: | 350° C., |
| Target material: | Si, |
| Substrate: | Si wafer. |

Figure 8A:
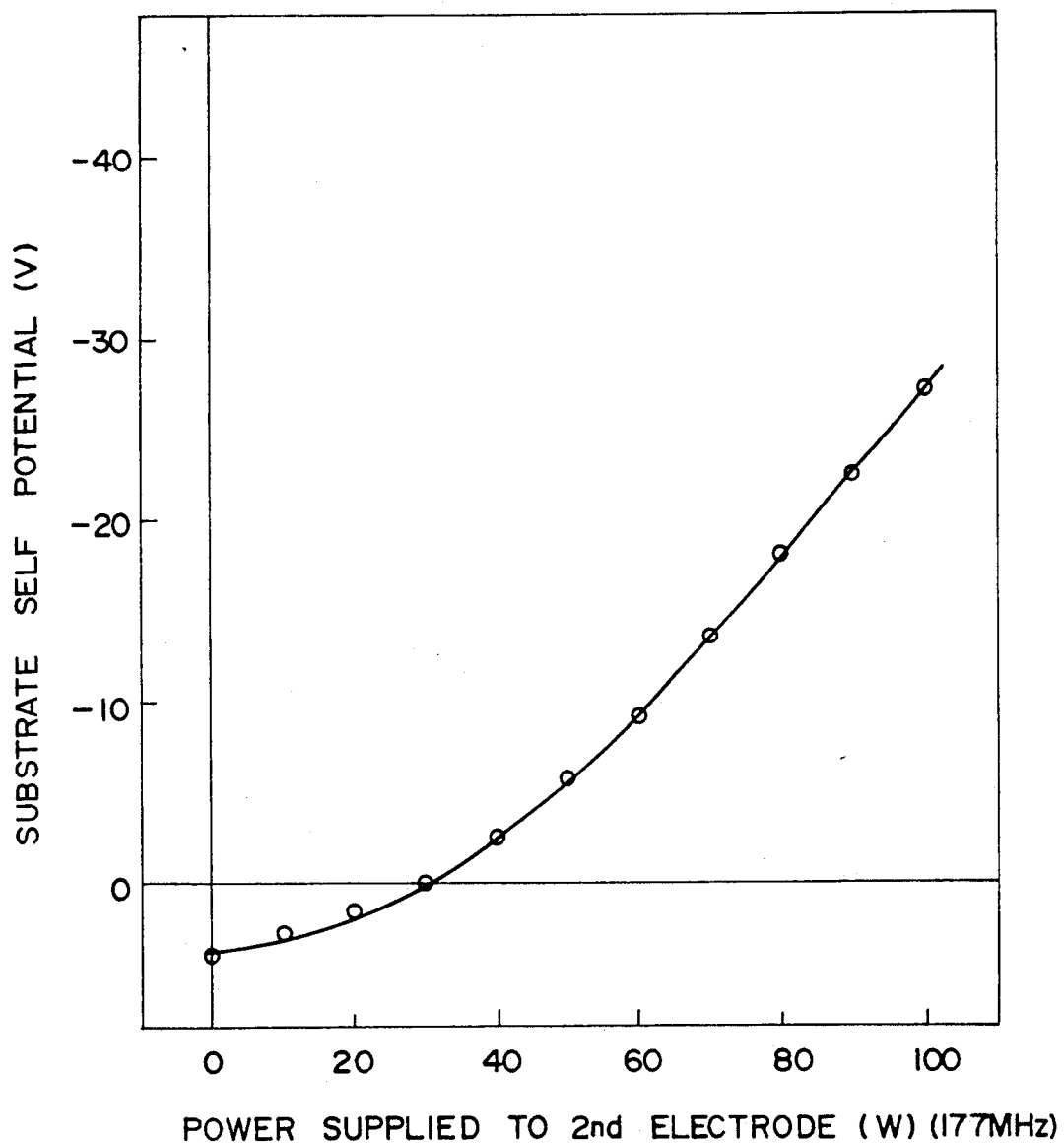
FIGS. 8A to 8C are charts indicating results obtained in an example 4.

Under the above-mentioned conditions, there was obtained a relationship shown in FIG. 8A between the substrate potential and the power supplied to the second electrode. Stated differently, in the apparatus of the present example, the substrate potential could be controlled within a range of $+4$ to $-27$ V by varying the power to the second electrode within a range of 0–100 W.

Figure 8B:
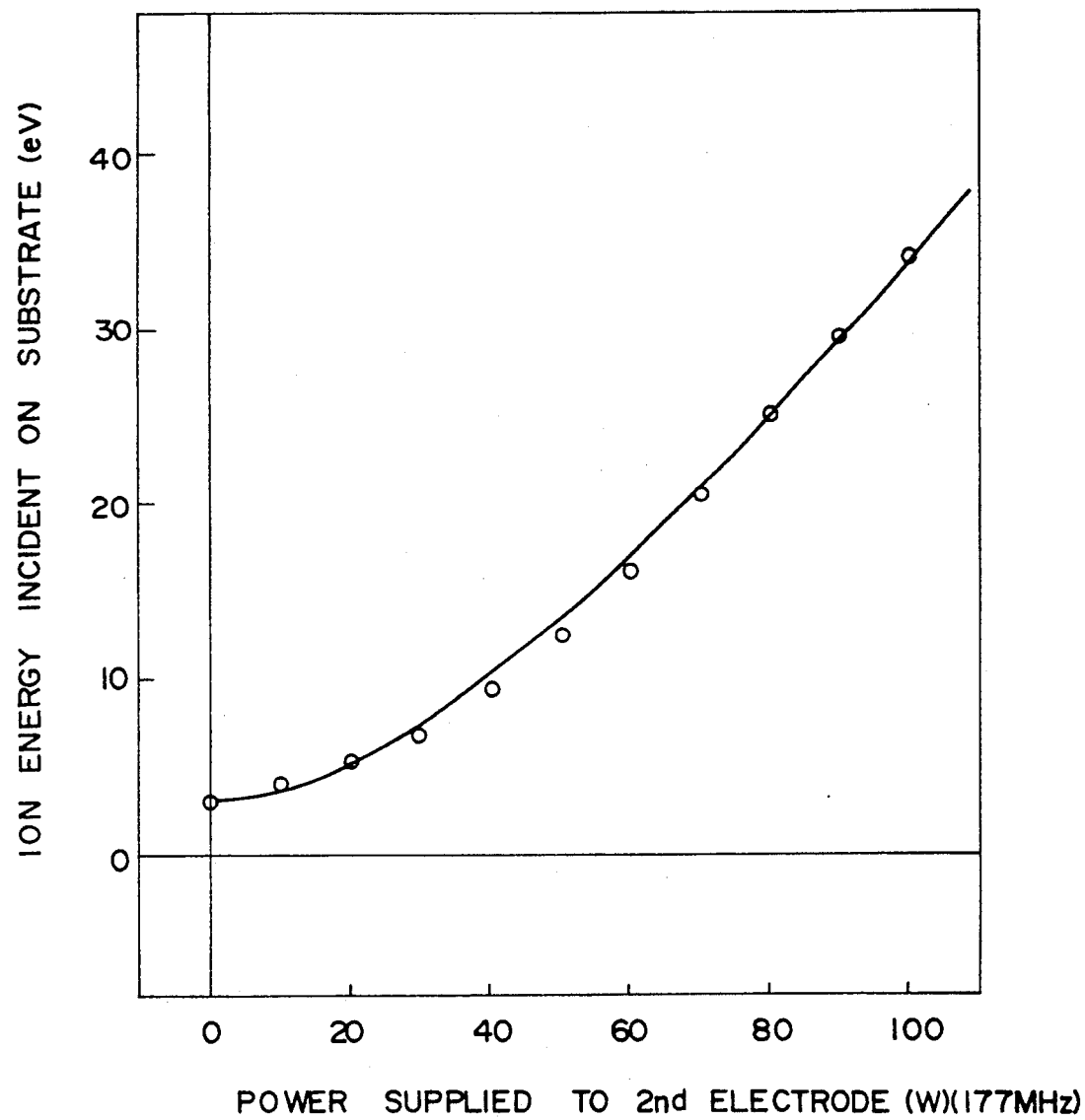

Also there was obtained a relationship shown in FIG. 8B between the incident ion energy and the power supplied to the second electrode at the film formation. Stated differently, in the present apparatus, the incident ion energy could be controlled within a range of 3–34 eV by varying the power to the second electrode within a range of 0–100 W.

Also the change in crystallinity of the Si film (thickness: 1000 Å) under different powers to the second electrode was investigated by electron beam diffraction, as shown in Table 1:

TABLE 1

| | Power to second electrode (W) | | | | | | | | |
|---|---|---|---|---|---|---|---|---|---|
| | 0 | 10 | 20 | 30 | 40 | 50 | 60 | 80 | 100 |
| Electron beam diffracted image | + | + | ++ | ++ | + | + | + | − | − | wherein + + indicates a Kikuchi's line; + indicates a streak; and − indicates a hallow.

As will be apparent from Tab. 1, it is possible to control the crystal structure of the film deposited on the substrate 706 by controlling the potential of the third electrode 703 enclosing the space between the first electrode 701 and the second electrode 702, applying an RF potential to the second electrode 702 and controlling the power supplied from the RF power source.

For example the electron beam diffracted image shows Kikuchi's line with a power of 20–30 W to the second electrode, so that a Si film can be epitaxially grown on the Si wafer by film formation under the above-mentioned condition.

Figure 8C:
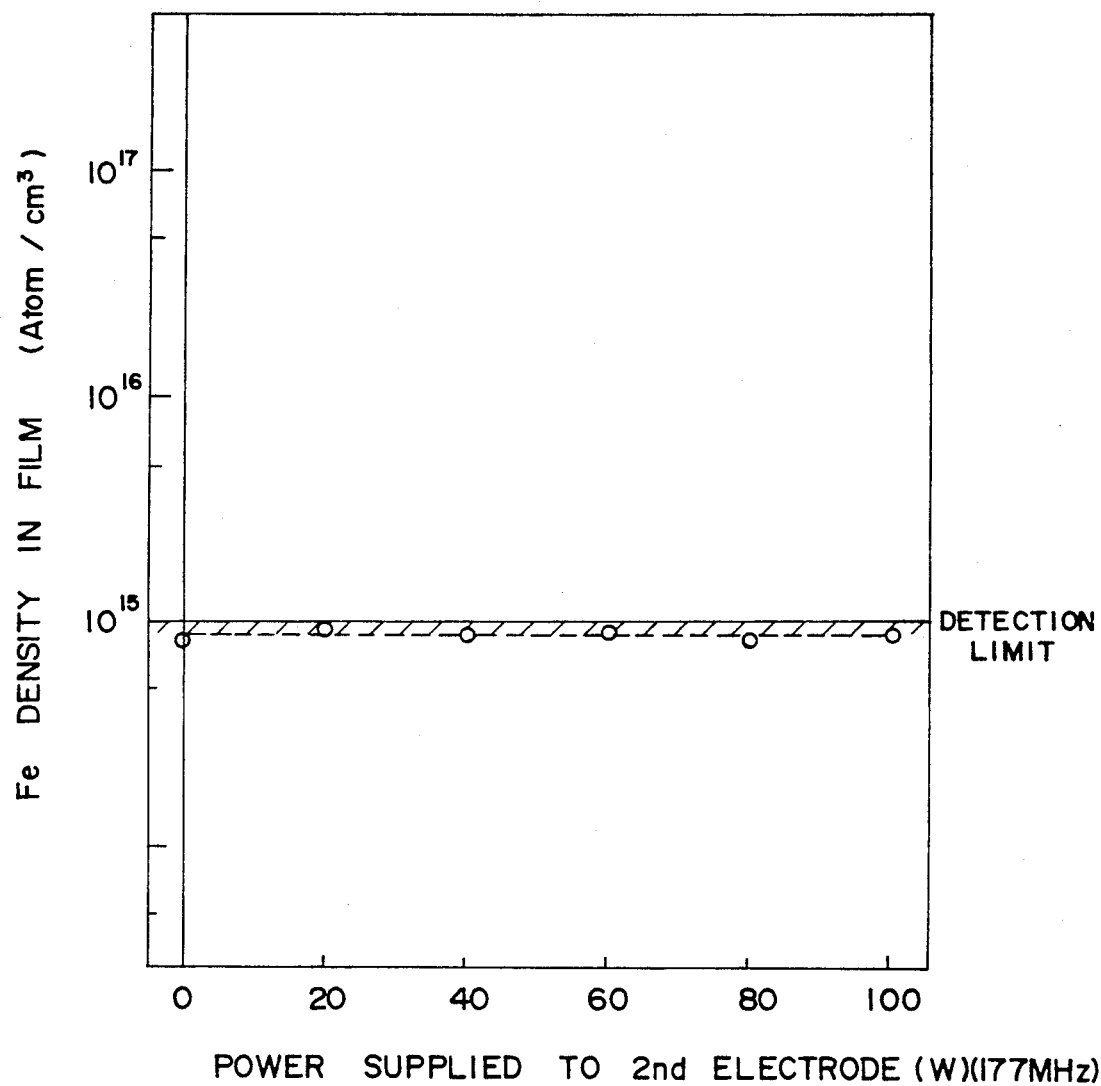

Also FIG. 8C indicates the concentration, measured by SIMS, of Fe which is the principal component of the vacuum chamber 708 and the third electrode 703 and which is incorporated in the Si film formed with the power of 0–100 W supplied to the second electrode. As shown in FIG. 8C, the Fe concentration in the obtained film was below the detection limit.

Also similar results were obtained by employing a conductive substrate 706 and effecting the potential supply to the second electrode with a DC power source.

We claim:

1. A plasma processing apparatus comprising:
a first electrode connectable with a plasma generating power source;
a second electrode capable of supporting a substrate to be subjected to a plasma-involving surface treatment;
a third electrode divided into plural portions enclosing a space between said first and second electrodes and having separate potentials applied to said plural portions all said electrodes being positioned in an evacuatable chamber; and
potential control means for independently controlling the potentials of said third electrode.

2. An apparatus according to claim 1, wherein said first electrode is constructed as to support a target, and said apparatus is adapted to form a film with a material supplied from said target, on the substrate supported by said second electrode.

3. An apparatus according to claim 1, wherein said third electrode is electrically insulated from said evacuatable chamber.

4. An apparatus according to claim 3, wherein said third electrode is connected through a DC power source to the evacuatable chamber.

5. An apparatus according to claim 1, wherein said evacuatable chamber serves also as said third electrode.

6. An apparatus according to claim 1, wherein said second electrode is connected to a high frequency power source.

7. An apparatus according to claim 6, wherein the frequency of the high frequency power source connected to said second electrode is different from that of the plasma generating power source connected to said first electrode.

* * * * *

UNITED STATES PATENT AND TRADEMARK OFFICE
CERTIFICATE OF CORRECTION

PATENT NO. : 5,316,645
DATED : May 31, 1994
INVENTOR(S) : ATSUSHI YAMAGAMI, ET AL.

Page 1 of 2

It is certified that error appears in the above-identified patent and that said Letters Patent is hereby corrected as shown below:

ON TITLE PAGE

In [56] References Cited, under FOREIGN PATENT DOCUMENTS:
"2050957" should read --2-50957--; and
"2159370" should read --2-159370--.

COLUMN 2

Line 40, "However" should read --However,--.

COLUMN 4

Line 24, "entering" should read --enter--.
Line 40, "electrode" should read --electrodes--.
Line 55, "marget" should read --target--.

COLUMN 6

Line 39, "to improve" should read --improvement in--.

COLUMN 7

Line 55, "Target material:       Si" should read
--Target material:       Si
  Substrate:             Si wafer.--.

COLUMN 8

Line 9, "measurement" should read --measurements--.

COLUMN 9

Line 2, "atom/cm$^3$," should read --atom/cm$^3$)--.

UNITED STATES PATENT AND TRADEMARK OFFICE
CERTIFICATE OF CORRECTION

PATENT NO. : 5,316,645
DATED : May 31, 1994
INVENTOR(S) : ATSUSHI YAMAGAMI, ET AL.

It is certified that error appears in the above-identified patent and that said Letters Patent is hereby corrected as shown below:

<u>COLUMN 10</u>

Line 28, "hallow." should read --halo.--.
Line 36, "example" should read --example,--.
Line 60, "electrodes" should read --electrodes,--.
Line 62, "portions" should read --portions,--.
Line 65, "said third" should read --said plural portions of said third--.

Signed and Sealed this

Thirteenth Day of December, 1994

Attest:

BRUCE LEHMAN

*Attesting Officer*  *Commissioner of Patents and Trademarks*